United States Patent [19]
Kikuchi et al.

[11] Patent Number: 5,633,175
[45] Date of Patent: May 27, 1997

[54] PROCESS FOR STRIPPING PHOTORESIST WHILE PRODUCING LIQUID CRYSTAL DISPLAY DEVICE

[75] Inventors: Hiroshi Kikuchi, Zushi; Yasushi Sano, Yokohama; Satoru Todoroki, Yokohama; Hitoshi Oka, Yokohama; Toshiyuki Koshita, Mobara; Masato Kikuchi, Mobara; Mitsuo Nakatani, Mobara; Michio Tsukii, Mobara, all of Japan

[73] Assignee: Hitachi, Ltd., Tokyo, Japan

[21] Appl. No.: 373,769

[22] Filed: Jan. 17, 1995

Related U.S. Application Data

[63] Continuation-in-part of Ser. No. 986,683, Dec. 8, 1992, Pat. No. 5,399,202.

[30] Foreign Application Priority Data

Dec. 19, 1991 [JP] Japan ................. 3-336600

[51] Int. Cl.⁶ .............. B08B 3/08; B08B 3/10; H01L 21/335
[52] U.S. Cl. .............. 438/30; 134/1.3; 134/2; 134/38; 510/176; 438/951; 438/158
[58] Field of Search ............. 437/40, 41, 21, 437/902; 216/91, 83; 134/1.3, 2, 38; 510/176

[56] References Cited

U.S. PATENT DOCUMENTS

| | | | |
|---|---|---|---|
| 4,646,424 | 3/1987 | Parks et al. | 29/571 |
| 4,704,783 | 11/1987 | Possin et al. | 437/40 |
| 4,850,381 | 7/1989 | Moe et al. | 134/62 |
| 4,859,617 | 8/1989 | Nomoto et al. | 437/40 |
| 4,898,639 | 2/1990 | Mue et al. | 156/345 |
| 4,933,296 | 6/1990 | Parks et al. | 437/40 |
| 4,984,597 | 1/1991 | McConnell et al. | 134/95 |
| 4,990,460 | 2/1991 | Moriyama | 437/40 |
| 5,032,531 | 7/1991 | Tsutsui et al. | 437/40 |
| 5,070,379 | 12/1991 | Nomoto et al. | 357/23.7 |

FOREIGN PATENT DOCUMENTS

| | | |
|---|---|---|
| 62049355 | 3/1987 | Japan . |
| 63-121848 | 5/1988 | Japan . |

*Primary Examiner*—R. Bruce Breneman
*Assistant Examiner*—Matthew Whipple
*Attorney, Agent, or Firm*—Antonelli, Terry, Stout & Kraus, LLP

[57] ABSTRACT

A liquid crystal display device is produced by effecting in the course of its production steps a resist-peeling method including the steps of (a) changing the quality of a resist layer on a substrate, (b) contacting the changed resist with a liquid containing 2-amino-1-ethanol, and (c) removing the liquid containing the thus peeled resist from the surface of the etched resist, and optionally, (d) regenerating a liquid containing 2-amino-1-ethanol by distillation from the liquid used in step (c) and reusing the regenerated liquid in step (b).

12 Claims, 7 Drawing Sheets

PROCESS FOR STRIPPING PHOTORESIST WHILE PRODUCING LIQUID CRYSTAL DISPLAY DEVICE

CROSS-REFERENCE TO RELATED APPLICATION

This is a continuation-in-part of application Ser. No. 07/986683 filed on Dec. 8, 1992, now U.S. Pat. No. 5,399,202.

BACKGROUND OF THE INVENTION

1. Field of the Invention

The present invention relates to a process for producing a liquid crystal display device using an excellent resist peeling liquid for forming a thin film pattern of an electrically conductive circuit and an insulator, and also using a process for peeling a resist with the resist-peeling liquid.

2. Description of the Related Art

As a process for producing an electronic device such as a liquid crystal display device, a semiconductor device, or any of various circuit base plates, there has been well known to those skilled in the art a process which comprises forming a thin film by sputtering or the like, forming a predetermined pattern on the thin film by the use of a photoresist by photolithography, removing unnecessary portions by etching, peeling off the photoresist and repeating the above procedure, thereby producing a product. In the case of a thin film transistor-liquid crystal display (referred to hereinafter as TFT-LCD) device which is a representative liquid crystal display device, a TFT substrate is produced by forming gate electrodes on a glass substrate through the steps of sputtering, photolithography, etching and resist-peeling; forming a gate-insulating film and amorphous silicon (a-Si) transistors through the steps of chemical vapor deposition (CVD), photolithography, etching and resist-peeling; forming indium tin oxide (ITO) electrodes through the steps of sputtering, photolithography, etching and resist-peeling; forming source and drain electrodes through the steps of sputtering, photolithography, etching and resist-peeling; and forming a passivation film through the steps of CVD, photolithography, etching and resist-peeling. The TFT substrate is laminated to a color filter substrate to seal up a liquid crystal in the gap between the TFT substrate and the color filter substrate to produce a color display. In such a series of steps, it is absolutely necessary that the photoresist-peeling step be perfect. Therefore, various proposals have been made for a resist-peeling liquid used for efficiently peeling a resist.

For example, JP-A-57-165834 discloses an amine type resist-peeling liquid, and JP-A-62-35357 discloses a phenol type resist-peeling liquid.

The above resist-peeling liquids are well known to those skilled in the art but involve the following problems in practical application.

An explanation is given below by taking the case of a novolak positive resist which is most generally used as a photoresist. In processes for producing various electronic devices, a resist formed on a substrate is irradiated with ultraviolet light through a predetermined mask, after which the exposed portion is removed by development, and the remaining resist is used as an etching resist. Concrete etching conditions vary depending on a substance to be etched, and etching types usable in this case are roughly classified into two classes: wet etching utilizing an electrochemical reaction in a solution, and dry etching utilizing the reaction of a radical in a gas phase.

Depending on the etching conditions of these processes, complicated chemical reactions are often caused on the surface of the resist. The change in quality of the surface layer of the resist by the reactions brings difficulty in completely peeling off the photoresist by the use of a conventional resist-peeling liquid. The incomplete peeling leaves a resist residue on the pattern or between the patterns formed by etching. Even when the amount of the residue is very small, the residue is a great factor causing defects such as burnout, short circuit, etc. in the subsequent steps such as film formation, photolithography, etching, etc. These defects decrease the reliability and yield of a product and hence cause inestimable losses in performance characteristics and economical benefit.

The above-mentioned conventional peeling liquids cannot cope with such a problem. In addition, there has been no method capable of solving such a problem and the problem of change in quality of the resist surface caused depending on various etching conditions, at the same time. Therefore, for coping with these problems, there has been no choice but, for example, to elongate the resist-peeling time, depending on etching conditions.

The present invention is intended to provide a resist-peeling liquid of extremely high performance which can completely peel the resist having a portion of which the quality has been changed during the above-mentioned etching process and does not leave the residue to the subsequent steps, and a process for peeling a resist by the use of the resist-peeling liquid.

In addition, since the above-mentioned conventional peeling liquids have a complicated composition, it has been very difficult to separate a resist from the peeling liquid after being used for peeling the resist, recover the peeling liquid and regenerate the same. Due to the complicated composition, even when a general separating method (e.g. distillation) is employed, a liquid recovered by distillation has a composition different from that of the original peeling liquid. Therefore, there has been no choice but to readjust the composition of the recovered liquid after analysis for its components. Such regeneration imposes a heavy economic burden, and disposal of the peeling liquid by a method such as incineration has been easier than the regeneration.

However, since it is obvious that the disposal by incineration of a large amount of the resist-peeling liquid composed mostly of one or more organic solvents has an undesirable influence on the global environment, it has been desired to develop a resist-peeling liquid which is free from the above problems and easy to recover and regenerate.

A first object of the present invention is to provide a process for producing a liquid crystal display device using the above-mentioned excellent resist-peeling liquid and using a process for peeling a resist with the resist-peeling liquid.

A second object of the present invention is to provide the aforesaid resist-peeling liquid which is easy to recover and regenerate.

A third object of the present invention is to provide a process for most effectively regenerating the above resist-peeling liquid easy to regenerate.

A fourth object of the present invention is to provide a peeling process suitable to the resist-peeling liquid of the present invention.

SUMMARY OF THE INVENTION

According to the present invention, there are provided a process for producing a liquid crystal display device which comprises the steps of:

(A) forming gate electrodes on a substrate,
(B) forming transparent electrodes on the substrate obtained in step (A),
(C) forming a gate-insulating film and amorphous silicon islands on the substrate obtained in step (B),
(D) forming source and drain electrodes on the substrate obtained in step (C), and
(E) forming a passivation film on the substrate obtained in step (D), characterized in that the resist-peeling in at least one of steps (A) to (E) is effected by a method comprising the steps of:

(a) changing the quality of a novolak positive resist layer on a substrate by an oxidative wet etching solution of metallic chromium, dry etching of silicon or aluminum, dry etching using oxygen plasma or ion implantation, (b) contacting the changed resist of step (a) with a liquid comprising 80% by weight or more of 2-amino-1-ethanol, and (c) removing the liquid containing the thus peeled resist from the surface of the etched resist; and a process for producing a liquid crystal display device which comprises the steps of:
(A) forming gate electrodes on a substrate,
(B) forming transparent electrodes on the substrate obtained in step (A),
(C) forming a gate-insulating film and amorphous silicon islands on the substrate obtained in step (B),
(D) forming source and drain electrodes on the substrate obtained in step (C), and
(E) forming a passivation film on the substrate obtained in step (D), characterized in that the resist-peeling in at least one of steps (A) to (E) is effected by a method comprising the steps of:

(a) changing the quality of a novolak positive resist layer on a substrate by an oxidative wet etching solution of metallic chromium, dry etching of silicon or aluminum, dry etching using oxygen plasma or ion implantation, (b) contacting the changed resist of step (a) with a liquid comprising 80% by weight or more of 2-amino-1-ethanol, (c) removing the liquid containing the thus peeled resist from the surface of the etched resist, and (d) regenerating a liquid containing 80% by weight or more of 2-amino-1-ethanol by distillation from the liquid used in step (c) and reusing the regenerated liquid in step (b).

Figure 1A:
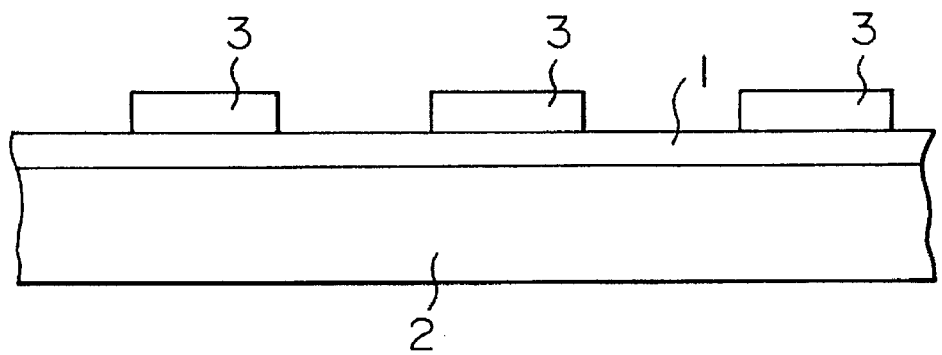
FIGS. 1a, 1b and 1c show a peeling procedure.

In the drawings, 1 shows a chromium thin film,
2 shows a glass substrate,
3 shows a photoresist,
4 shows a layer of which the quality has been changed,
5 shows a residue left after peeling,
6 shows the area of an original resist,
7 shows a spray type peeling bath,
8 shows a pump,
9 shows a filter,
10 shows a peeling liquid,
11 shows a spray nozzle,
12 shows a substrate,
13 shows an ultrasonic peeling bath,
14 shows an ultrasonic generator,
15 shows a sheet-fed type resist-peeling apparatus,
16 shows a loader unit,
17 shows a front substrate-angularly moving section,
18 shows a back substrate-angularly moving section,
19 shows a sheet-fed type transferring system,
20 shows a sheet-fed type immersion-peeling bath,
71 shows an immersion-treating unit,
72 shows a rinse unit,
73 shows a water-washing unit,
74 shows an ultrasonic water-washing unit,
75 shows a drying unit,
26 shows an unloader unit,
27 shows a cassette,
28 shows a substrate,
29 shows a transferring roller,
30 shows a conveying robot,
31 shows substrate-fixing stations,
32 shows a lower tank,
33 shows a spray nozzle,
34 shows an ultrasonic washer,
35 shows air knives,
36 shows another cassette,
37 shows the first distillation unit,
38 shows the second distillation unit,
39 shows a distillation pot,
40 shows a valve,
41 shows a continuous feed port,
42 shows the used peeling liquid,
43 shows a condenser,
44 shows a recovery tank,
45 shows an exhaust pump,
46 shows low-boiling component water,
47 shows a pump,
48 shows low-boiling component drain,
49 shows a transporting line,
50 shows a regenerated peeling liquid,
51 shows recovered drain,
52 shows high-boiling component drain, 53 shows a glass substrate,
54 shows a gate electrode,
55 shows an alumina film,
56 shows an ITO electrode,
57 shows a SiN film,
58 shows an a-Si film (i layer),
59 shows an a-Si film (n layer),
60 shows a chromium film,
61 shows an aluminum film,
62 shows a SiN film for passivation,
101 shows data obtained for a protic solvent,
102 shows data obtained for an approtic solvent,
103 shows data obtained for a chlorine-containing solvent,
104 shows data obtained for 2-amino-1-ethanol.

DETAILED DESCRIPTION OF THE INVENTION

Compounds suitable for the resist-peeling liquid of the present invention are primary aliphatic amines of 2–6 carbon atoms. They are preferably compounds of 2–6 carbon atoms having in the molecule one or two hydroxyl groups and one amino group with the proviso that the hydroxyl and amino groups are not bonded to the same carbon atom. They are characterized by the following general formula (1):

$$HO-R-NH_2 \qquad (1)$$

wherein —R— is an alkylene group of 2–6 carbon atoms which optionally carries a hydroxyl group.

Specific examples of the compounds suitable for the resist-peeling liquid of the present invention are 2-amino-1-ethanol, 1-amino-2-propanol, 2-amino-1-propanol, 1-amino-2-butanol, 2-amino-1-butanol, 5-amino-1-pentanol, 6-amino-1-hexanol, 3-amino-1,2-propanediol, etc. Of these, 2-amino-1-ethanol, 1-amino-2-propanol and 2-amino-1-propanol which have a low molecular weight, are preferable because of the high penetrability into resist materials. 2-Amino-1-ethanol is most preferable.

As a result of various investigations, the content of the primary aliphatic amines of 2–6 carbon atoms which are suitable for the resist-peeling liquid of the present invention is 100 to 80% by weight, preferably 100 to 90% by weight, more preferably 100 to 95% by weight. The above lower limit of the content is determined so as to permit the complete peeling of not only a resist not having a portion of which the quality has been changed but also a resist having a portion of which the quality has been changed by etching. Since such restriction on the content may be unnecessary for peeling off a resist not having a portion of which the quality has been changed, it should be particularly emphasized that the present invention is very effective in peeling a resist having a portion of which the quality has been changed.

In peeling the resist having a portion of which the quality has been changed, not only the above-mentioned primary aliphatic amines of 2–6 carbon atoms are effective, but there may also be used aliphatic amines having no OH group, such as ethylene diamine and triethylenetetramine, etc., and aromatic amines such as aniline, anisidine, etc. Practically, however, the toxicity of a peeling liquid is required to be low. From this point of view, its $LD_{50}$ in oral administration is preferably 2,000 mg/kg or more. In addition, for preventing the evaporation of the peeling liquid and lowering its flammability, its boiling point is preferably about 150° or higher. Therefore, practically applicable peeling liquids should be selected by considering the peeling capability for the resist having a portion of which the quality has been changed, the safety and the cost factor. Furthermore, for economical recovery and regeneration of the resist-peeling liquid after use, the number of components of the peeling liquid is preferably small. In practice, the peeling liquid is preferably composed of one component. In the present invention, as a result of various investigations, there has been found as a peeling liquid satisfying all of such requirements a peeling liquid comprising the above-mentioned primary aliphatic amine of 2–6 carbon atoms in a proportion of 80% by weight or more.

The resist-peeling liquid of the present invention is suitable particularly for peeling a layer formed by the change in quality of the surface of a resist, which change in quality is caused by a strongly oxidative wet etching solution of metallic chromium, dry etching of silicon or aluminum, dry etching using oxygen plasma, or ion implantation.

As an operating temperature suitable for peeling a resist by the use of the resist-peeling liquid of the present invention, any temperature between room temperature and the boiling point of the liquid may be employed, although a temperature of 30°–90° C. is preferable and a temperature of 40°–70° C. is more preferable. Such a temperature condition is determined so as to permit the peeling of the resist in a short time, reduce the loss of the peeling liquid by evaporation, and prevent the ignition of the peeling liquid.

For peeling a resist by the use of the resist-peeling liquid of the present invention, simply carrying out the following steps is sufficient: the resist-peeling liquid is brought into contact with the surface of the etched resist, after which the resist-peeling liquid containing the photoresist thus peeled off is removed from the surface of the etched resist. A method for the peeling is not critical. There may be employed the so-called immersion peeling, in which a substrate having a resist to be peeled off is immersed in a peeling liquid for a prescribed period of time. The so-called spray type peeling method, in which a peeling liquid is supplied to a resist by spraying, is more preferable for shortening the peeling time. The so-called ultrasonic peeling method, in which ultrasonic waves are applied to a peeling liquid during immersion peeling, is more preferable for shortening the peeling time greatly.

However, the selection of a peeling method should not be made based only upon the length of peeling time, and it is necessary to consider economical conditions including an equipment cost.

From such a viewpoint, in the case of the spray-peeling method, exhaustion of a large amount of mist produced becomes a problem, and in the case of using an ultrasonic wave, it becomes necessary to provide a special peeling bath and an electric source for generating the ultrasonic wave.

In the case of the immersion-peeling method free from the above problems, a highly efficient peeling method can be realized by optimizing the peeling method.

In the production of such an electronic device as a liquid crystal display device, usually, a substrate is put in a cassette, the cassette is set in a peeling device and thereafter, the substrate is taken out of the cassette one by one, subjected to peeling a resist and then put in another cassette.

As the method of treating the substrate taken out of the cassette, it is general to treat the substrate by spraying while transferring the substrate so that the surface to be treated is maintained horizontally. However, there is a problem of generation of mist as mentioned above, and when the peeling is effected by an immersion treatment for avoiding this problem and other treatments such as rinse, water-washing, drying and the like are effected by the treatments as above, the following problem is caused.

That is, when the substrate is treated one by one in a horizontal type equipment while taken out at a constant time interval from the cassette, no great problem is caused when the process-treatment time necessary for the peeling is substantially balanced with the time for treatments such as rinse, water-washing, drying, loading, unloading and the like before and after the peeling treatment; however, when the process-treatment time is remarkably long as compared with the treating time before and after the peeling treatment, a very great trouble is caused.

Specifically, when the process-treatment time is markedly long as compared with the treatment time before and after the peeling treatment, it is necessary that a horizontal transferring type sheet-fed type peeling treatment unit be utilized by the following two methods:

The first method is a method by which the substrate is withdrawn at a constant tact and transferred at a constant speed, and the number of immersion-peeling baths is increased to a number satisfying the process-treatment time, thereby securing the process-treatment time. In this case, when the substrate-withdrawing tact is indicated at $t_1$ and the residence time of the substrate in the immersion-treating unit is indicated as $t_2$, the treatment time T per lot can be represented by the following equation in which one lot consists of n sheets of substrate:

$$T = nt_1 + t_2.$$

In this first case, the treatment time T per lot is increased as much as $t_2$ is increased as compared with the usual case where the process-treatment time is substantially the same as the treating time before and after the peeling treatment. However, considering that it is usual to treat a lot consisting of about 10 to 50 sheets of substrate (n=about 10–50), the process-treatment time T is not so remarkably large.

However, the immersion-treating unit becomes as remarkably large as the number of immersion-peeling baths is increased and encounters with such difficulties that the immersion-treating unit cost is remarkably increased and the area for setting up the peeling apparatus becomes remarkably increased.

According to the second method, a substrate is allowed to stand or shaken in the forward and backward directions in an immersion-peeling bath to secure the process-treatment time. In this case, it is not necessary to increase the number of immersion-peeling baths, and accordingly, the apparatus does not become large.

However, a substrate is stayed in the immersion-peeling bath for a certain period of time, during which another fresh substrate cannot be treated, and therefore, there is such a disadvantage that the tact becomes remarkably large and, as a result, the treatment time T per lot is greatly increased.

A preferable peeling method for avoiding these problems comprises angularly moving a substrate withdrawn horizontally from a cassette so that the resist-carrying surface extends vertically immersing the substrate while keeping the position in an immersion-peeling bath at the predetermined station for the necessary time to peel the resist, subsequently withdrawing the substrate from the immersion-peeling bath, angularly moving the substrate so that the resist-carrying surface extends horizontally and subjecting the substrate to treatments, while keeping the position, such as rinse, water-washing, drying and the like.

By using said peeling method of the present invention, a long-term immersion treatment becomes possible, so that the substrate can be treated at a short interval tact $t_1$ while a sufficient immersing time is secured. Therefore, the treatment time T per lot is as short as in the first case mentioned above, while the unit may be as small as in the second case mentioned above.

To recover and regenerate the resist-peeling liquid of the present invention, merely conducting the distillation of the peeling liquid is sufficient.

In general, the solubility of a macromolecular material such as a resist in a solvent such as a peeling liquid is often discussed by relating it to the solubility parameter of the material in the solvent. However, the solubility can be explained on the basis of the solubility parameter only when the dissolution reaction is governed by an interaction based on van der Waals force. In the case of a system in which the dissolution reaction is governed by an interaction other than the above interaction, there is no choice but to experimentally investigate the solubility.

The peeling effect of a resist-peeling liquid can be understood as an effect brought about by combination of the following two actions: the peeling liquid rapidly penetrates into a solid resist material to swell the resist, and it dissolves the swollen resist material. In general, in the case of novolak positive resists, the major part of resist material is composed of a cresol novolak resin having a high molecular weight, and the remaining part is composed of, for example, a photosensitizer having a relatively low molecular weight. The novolak positive resists are described in detail in W. S. DeForest, "Photoresist", Chapter 2, Types of Photoresist, pp. 19–60, Chapter 5, Positive Resist, pp. 132–162, McGraw-Hill, 1975. For peeling such novolak positive resists, it is absolutely necessary to use a peeling liquid having high capability of dissolving novolak resins having a high molecular weight, which are inherently difficult to dissolve.

In addition, it is speculated that in a resist having a portion of which the quality has been changed on the surface by an etching process or the like, the cross-linking between the molecules of the resist material has proceeded owing to the action of high-energy plasma particles, etc., so that the resist material has a markedly high molecular weight. For rapid swelling and dissolution of not only the portion of which the quality has been unchanged but also the portion of which the quality has been changed, a marked improvement of the dissolving ability of a peeling liquid is necessary.

From this point of view, there was investigated the solubility of a resist material of which the quality has been changed, in various solvents. Consequently, it was experimentally found that the best peeling effect can be obtained by the use of the resist-peeling liquid of the present invention.

Since the primary aliphatic amine of 2–6 carbon atoms used in the resist-peeling liquid of the present invention contains a basic amino group in the molecule, it has a very high affinity for novolak resins (which are weakly acidic compounds), penetrates into a resist easily, and can dissolve not only the resist portion of which the quality has been unchanged but also the resist portion of which the quality has been changed, in a short period of time. In the present invention, for making the best use of such desirable properties of the aliphatic amines, it is preferable to make the activity of the aliphatic amine in the peeling liquid as high as possible. From this point of view, the peeling liquid contains 80% by weight or more, preferably 90% by weight or more, more preferably 95% by weight or more, of the primary aliphatic amine of 2–6 carbon atoms.

On the other hand, also for recovery and regeneration of the peeling liquid after use, it is very advantageous that the peeling liquid contains a high concentration of the aliphatic amine. In detail, the components of a resist dissolved in the peeling liquid can easily be separated from the peeling liquid merely by applying a separating method such as distillation to the used peeling liquid. Hence there can be removed the economic burden imposed by analysis for and adjustment of the components after the distillation. The generation method in the present invention is not limited to distillation. There can be employed separating methods other than distillation, for example, membrane separation. The employment of the other separating methods is, as a matter of course, made possible by the employment of a high concentration of the aliphatic amine in the present invention. The choice of the separating method depends mainly on economic reasons in itself, and it should be emphasized that whatever separating method is employed, the above effect can be obtained, namely, the economic burden imposed by analysis for and adjustment of the components can be removed.

In order to efficiently conduct the regeneration by distillation, it is preferable that the scale of distillation is large, in other words, a large amount of the used peeling liquid is treated at one time, and it is general to prepare a tank for storing a large amount of the used peeling liquid in the neighborhood of the production apparatus, transport the stored used peeling liquid by a tank lorry or the like therefrom to a distillation equipment, transport and bring back the distilled and regenerated peeling liquid, store the same in a tank for exclusive use of the regenerated peeling liquid and then utilize the regenerated peeling liquid in the production.

In such a treatment case, it is preferable to make the distillation scale large for reducing the cost for the regeneration by distillation; however, it is necessary to prepare a large scale storing equipment for the fresh and used peeling liquids in order to prevent the production of commercial products from being disturbed by enlarging the distillation scale. Moreover, the cost for preventing disasters which would accompany always storing a large amount of the peeling liquid cannot be ignored.

In addition, there is such a disadvantage that since the peeling liquid used at elevated temperatures is cooled and then transported, the cooled peeling liquid is again heated when distilled to be regenerated, and the regenerated peeling liquid is again cooled and transported and further heated when reused, the energy loss is considerably large.

In order to solve the above-mentioned problems, it is ideal to set up a small scale distillation equipment in the neighborhood of the production apparatus and establish such a continuous regeneration system that the high temperature used peeling liquid from the production apparatus is immediately sent to the distillation equipment and the regenerated peeling liquid recovered in the distillation equipment is returned to the production apparatus and reused. If such a system should be realized there could be omitted the large scale storing equipment and the transportation of a large amount of the used peeling liquid and a large amount of the regenerated peeling liquid, and in addition, the energy required for the regeneration could be greatly reduced. Therefore, its economic effect would have an inestimable value.

However, it is necessary to know that there be such limits as mentioned below in order to realize such a continuous regeneration system.

When the peeling liquid of the present invention is used, the used peeling liquid contains not only the photoresist dissolved therein but also water which the water-soluble amine has absorbed from the air.

In a conventional large scale batchwise distillation as mentioned above, the low-boiling component water contained in the used peeling liquid and high-boiling components such as photoresist and the like are fractionated at different time by such a temporal operation that the former is obtained as an initial distillate and the latter are obtained as the residue after the distillation. However, when the regeneration by distillation is conducted continuously on a small scale in the neighborhood of the production equipment, such a time-different or a temporal fractionating system is difficult to adopt and a continuous distillation-separation system is desired.

For this purpose, in a preferable regeneration system, at least two distillation units are provided, the distillation section of the first distillation unit is used for vaporizing water which is one of the low-boiling components, the used peeling liquid from which water has been removed therein is continuously distilled in the distillation section of the second distillation unit to continuously recover the peeling liquid component.

In such distillation, the heat of the high temperature used peeling liquid generated in the peeling step is utilized to remove the water in the distillation section of the first distillation unit, and the heat of the high temperature used peeling liquid from which water has been removed is utilized to recover the peeling liquid in the distillation section of the second distillation unit. It is possible to conduct such a regeneration continuously and efficiently.

In order to efficiently utilize the heat energy which the used liquid has, it is preferable to conduct the regeneration in the neighborhood of the peeling equipment, the distance being preferably about 1,000 m or less, more preferably 500 m or less, and most preferably 200 m or less.

Also, the distillation is preferably effected under reduced pressure to lower the boiling point at the time of distillation.

DESCRIPTION OF THE PREFERRED EMBODIMENTS

Examples are described below for explaining the present invention in further detail.

EXAMPLE 1

An example is explained below with reference to the diagram of the peeling procedure shown in FIG. 1.

A glass substrate 2 (10-cm square, 1.1-mm thickness) having a thin chromium film 1 (150-mm thickness) on the surface was prepared by sputtering. Onto the whole surface of the chromium film 1, a novolak positive photoresist (OFPR-800, mfd. by Tokyo Ohka Kogyo Co., Ltd.) was applied so as to form a layer having a thickness of 2 µm with a spinner. Then, the resulting body was baked at 120° C. for 30 minutes. Thereafter, the baked body was exposed to light and developed according to a conventional method, to form a photoresist 3 (an etching resist pattern) on the chromium film 1 (FIG. 1a).

Figure 1B:
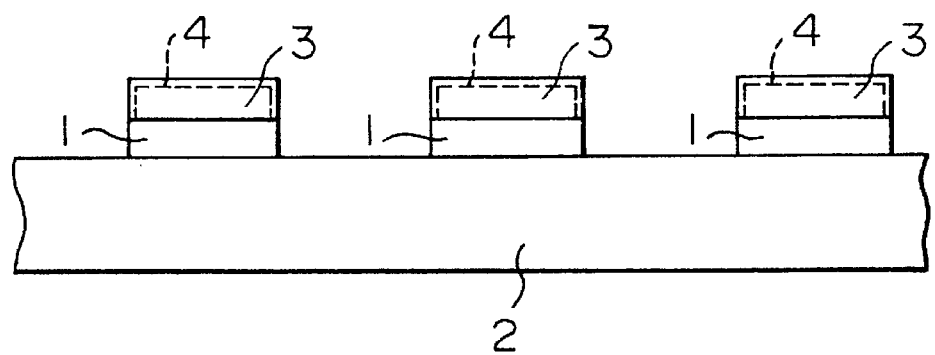

Thereafter, the body having the etching resist pattern 3 on the surface was immersed in a conventional chromium etching solution (composed mainly of cerium nitrate ammonium), to dissolve away the exposed chromium portions. Then, the resulting body was washed with water and dried. By the above procedure, a very thin layer 4 of which the quality has been changed was formed on the surface layer of the resist (FIG. 1b).

Figure 1C:
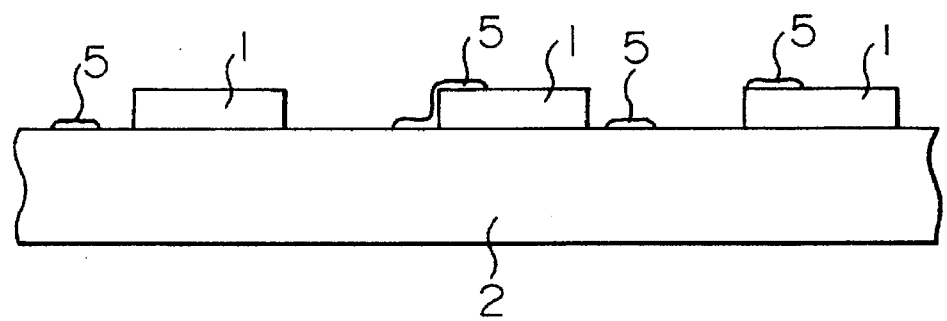

Then, the dried body was immersed in any one of the resist-peeling liquids described below, to peel off the resist. The resist-peeled body was rinsed with deionized water and then dried. Thereafter, the whole surface of the resulting body was inspected with an optical microscope for observation of the state of peeling off of the resist and for determination whether residues 5 were left adhered to the chromium wiring or in the spaces between the chromium wirings. Based on the results of the inspection, the peeling capabilities of the peeling liquids were compared (FIG. 1c).

As a control, a resist was peeled off from a body having an etching resist pattern which body had not yet been immersed in the chromium etching solution. Thus, the influence of the etching operation on the peelability of the resist was investigated.

As representative choices from aliphatic amines, 2-amino-1-ethanol (monoethanolamine, a primary amine), diethanolamine (a secondary amine), and triethanolamine (a tertiary amine) were selected. The peeling capabilities of these amines were tested by using them as a peeling liquid.

Specifically, the test was conducted as follows:

Three peeling-liquid baths containing the same fresh peeling liquid were prepared. They were heated to 60° C. The chromium-etching body was immersed successively in the three baths for 2 minutes each, whereby peeling was conducted for 6 minutes in total. The above procedure was carried out for the above three kinds of the peeling liquids for comparing their peeling capabilities.

Figure 2:
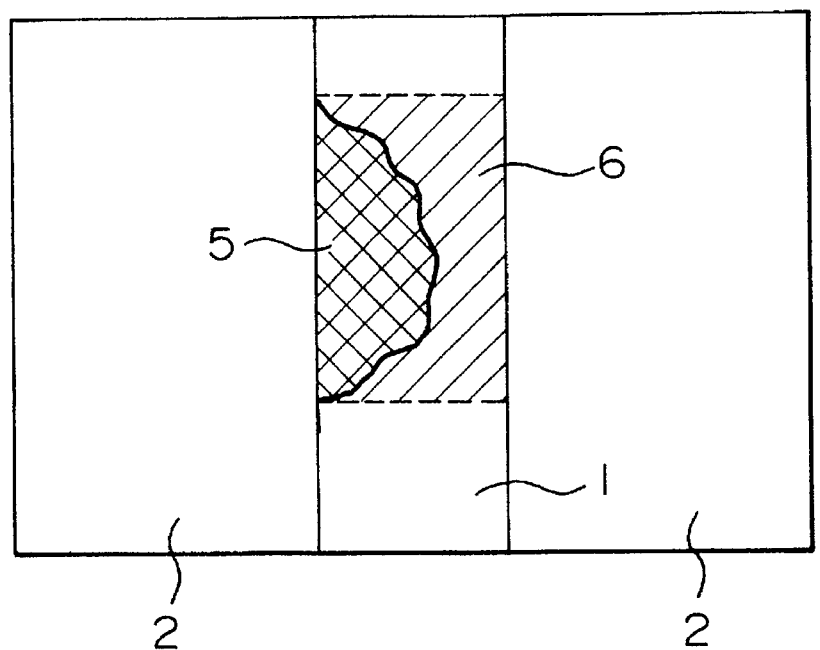
FIG. 2 shows a method for calculating the percentage of residue left after peeling.

The peeling capability was determined by the observation of the surface of the body after peeling as follows. A state in which the residue remained in the form of a thin film over the whole surface of the resist pattern after peeling was judged as unsatisfactory peeling. A state in which the residue had been completely removed off from the surface of the pattern and from the space between the patterns after peeling was judged as complete peeling. An intermediate state between the above two states, i.e. a state in which the residue partly remained on the pattern or between patterns in the form of a thin film, was judged as partial peeling. The degree of remaining of the residue after peeling was quantitatively expressed by the following method. As shown in FIG. 2, the area of a residue left after peeling 5 which had adhered to the chromium thin film 1 (chromium wiring) was measured. The ratio of this area to the area of an original resist 6 was calculated according to the following equation defining the percentage of residue left after peeling:

$$\text{Percentage of residue left after peeling (\%)} = \left( \frac{\text{Area of residue left after peeling 5}}{\text{Area of original resist 6}} \right) \times 100$$

The percentage of residue left after peeling which is calculated by the above method is suitable for evaluating the capability of a peeling liquid, because it permits quantitative treatment of a residue in a very small portion of a wiring and makes it possible to make quantitative the worst case which tends to lead to an unsatisfactory result.

When the percentage of residue left after peeling is employed, it is obvious that only peeling liquids capable of giving a percentage of residue left after peeling of zero are preferable for the production of electronic devices.

In this case, a point to which special attention should be paid is that since the residue adheres to the wiring or spaces between the wirings with high probability, as shown in FIG. 1c, the residue is liable to be overlooked unless the whole surface of the substrate after the peeling is inspected over a large area.

The resist-peeling capabilities of the above three amino alcohols were compared according to the above quantitation method. Table 1 shows the results. In the peeling off of the resist (A) which had not immersed in the chromium etching solution, all the amino alcohols could achieve complete peeling. There was found no significant difference in resist-peeling capability for the resist (A) between the amino alcohols.

However, surprisingly, in the peeling off of the resist (B) which had immersed in the chromium etching solution, there was a marked difference in peeling capability between the three amino alcohols. The following order of resist-peeling capability was found to hold for the amine moiety in the amino alcohols:

$$tertiary < secondary < primary.$$

Monoethanolamine, a primary amine, could easily achieve complete peeling, and the percentage of residue left after peeling was zero. In contrast, triethanolamine, a tertiary amine, caused unsatisfactory peeling, and the percentage of residue left after peeling was 100%. Thus, triethanolamine was of no practical use as a peeling liquid. Diethanolamine, a secondary amine, had a capability intermediate between those of the above two amines. It caused partial peeling in which a small amount of a residue was observed to be left after peeling.

These results demonstrated that the capability of a resist-peeling liquid depends on whether the liquid can easily peel off not only the resist portion of which the quality has been unchanged but also the resist portion of which quality has been changed during the process for the production of an electronic device. Thus, it was found that when the quality of the surface layer of a resist has been changed during the reaction of a chromium etching solution with the resist by immersing the resist in the etching solution, the capability of a peeling liquid in peeling the resist having such a quality-changed layer on the surface cannot easily be estimated from its peeling capability for the resist having no such layer. Furthermore, it was also found that a peeling liquid capable of peeling off the resist having a layer of which the quality has been changed can be selected only by the experimental determination of the capability of a peeling liquid.

That the primary amino alcohol has the highest peeling capability is believed to be due to the strong basicity of the primary amine moiety in the molecule. It should also be emphasized that the present invention has revealed, for the first time, the fact that such a strong base dissolves a resist of which the quality has complicatedly been changed.

EXAMPLE 2

The peeling capabilities of peeling liquids were examined in the same manner as in Example 1 as follows. Specifically, three peeling-liquid baths containing the same fresh peeling liquid were prepared. They were heated to 60° C. A chromium-etched body was immersed successively in the three baths for 2 minutes each, whereby the peeling was conducted for 6 minutes in total. As the peeling liquids, monoethanolamine (2-amino-1-ethanol), which had been found to have the highest peeling capability in Example 1, and isopropanolamine (1-amino-2-propanol), which is also a primary amino alcohol, were selected. For comparing their peeling capabilities, peeling liquids were prepared by diluting each amino alcohol with propylene glycol ethyl ether as an organic solvent, and the relationship between the amino alcohol concentration and the peeling capability was determined.

Figure 3:
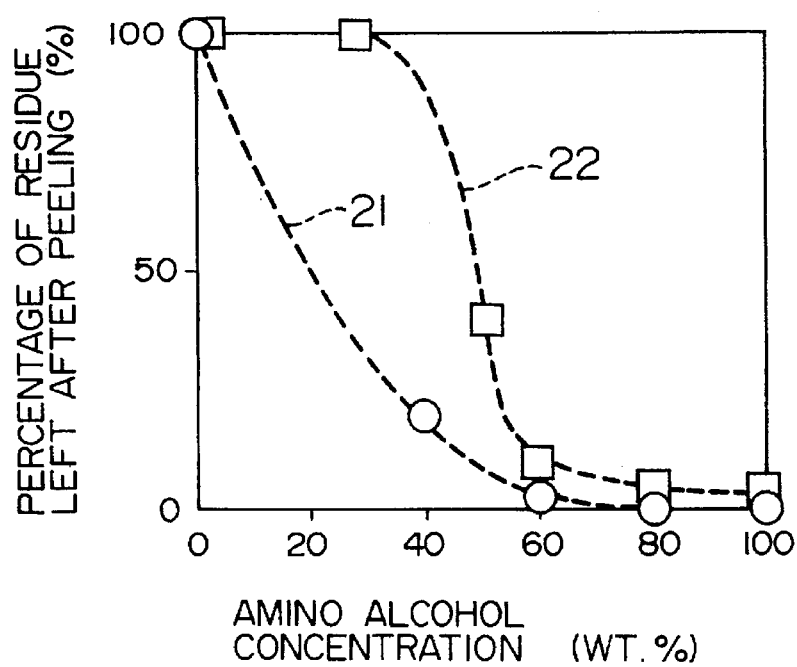
FIG. 3 shows a family of curves of percentage of residue left after peeling vs. amino alcohol concentration at different amino alcohol species.

FIG. 3 shows the results. As seen in FIG. 3, it was found that the amount of a residue left after peeling was decreased, even when the resist had a surface portion of which the quality had been changed by the chromium etching, as the concentration of the amino alcohol got close to 100% by weight. In particular, it was found that for attaining the best peeling capability, the concentration of amino alcohol should be adjusted to 80% by weight or more, preferably 90% by weight or more, more preferably 95% by weight or more. It was also found that for peeling off the resist having a portion of which the quality had been changed, a concentration at which the activity of the amino alcohol is the highest should be chosen within the above range.

In addition, it was found that when the primary amino alcohols were compared with each other, monoethanolamine capable of giving a percentage of residue left after peeling of zero is preferable to isopropanolamine which gave a percentage of residue left after peeling of several percent even when its concentration was 95% by weight or more. It is conjectured that such a difference is due mainly to the difference in molecular weight between the amino alcohols. The amino alcohol having a lower molecular weight was found to have a higher peeling capability.

EXAMPLE 3

Peeling liquids were examined for peeling capability according to the same manner as in Example 1 as follows. Specifically, three peeling liquid baths containing the same fresh peeling liquid were prepared. They were heated to 60° C. A chromium-etched body was immersed successively in the three baths for 2 minutes each, whereby the peeling was conducted for 6 minutes in total. The peeling liquids were prepared by mixing each of various organic solvents with monoethanolamine, which had been found to have the highest peeling capability in Examples 1 and 2. The relationship between the proportion of monoethanolamine and the peeling capability was determined.

Table 2 shows the results. As seen in Table 2, it was found that irrespective of the kind of the organic solvent mixed, even the resist (B) having on the surface a portion of which the quality had been changed by chromium etching solution was completely peeled off within the amino alcohol proportion range of about 80% by weight or more. In other words, the highest peeling capability could be attained within this range. In addition, it was found that the resist (A) having on the surface a portion of which the quality had been unchanged could be completely peeled off by the use of any of the peeling liquids, regardless of the proportion of monoethanolamine. On the basis of these results, it was found, as in Example 2, that for peeling the resist having a portion of which the quality had been changed, the proportion of the amino alcohol should be selected within the high concentration region so as to obtain the highest capability.

These results also demonstrate that the present invention is remarkably effective particularly in peeling a resist having a portion of which the quality has been changed, and that such an effect has been quite unpredictable from the peeling capability for a resist having no such quality-changed portion.

Furthermore, it is also seen that the range of the optimum proportion of the amino alcohol slightly varies depending on the operation temperature of the peeling liquid. That is, it is also seen that in operation at a relatively low temperature, the proportion of the amino alcohol is preferably high, namely, 90% by weight or more. In addition, it is seen that a peeling liquid containing the amino alcohol in a proportion of 95% by weight or more is the most preferable. This is because the amino alcohol serving as peeling liquid is a compound available as a solvent, so that the economic burden imposed by preparation of a resist-peeling liquid by addition of other solvents can be removed. Moreover, the restriction on the operating temperature is not severe.

EXAMPLE 4

Peeling liquids were examined for peeling capability according to the same manner as in Example 1 as follows. Specifically, three peeling liquid baths containing the same fresh peeling liquid were prepared. They were heated to 60° C. A chromium-etched body was immersed successively in the three baths for 2 minutes each, whereby the peeling was conducted for 6 minutes in total. As the peeling liquids, monoethanolamine, which had been found to have the highest peeling capability in Example 1, and other various primary amines having a chemical structure closely related to that of monoethanolamine were selected and examined.

The amino alcohol used in the above examination were monoethanolamine (2-amino-1-ethanol), 1-amino-2-propanol, 2-amino-1-propanol, 1-amino-2-butanol, 2-amino-1-butanol, 5-amino-1-pentanol, 6-amino-1-hexanol, and 3-amino-1,2-propanediol.

Table 3 shows the results. As seen in Table 3, monoethanolamine can completely peel off either the resist (B) having on the surface a portion of which the quality has been changed by the chromium etching and the resist (A) having no such portion. It is also seen that when used for peeling the resist having a portion of which the quality has been changed, the amino alcohols having a higher molecular weight than that of monoethanolamine can achieve substantially complete peeling, although they cause formation of a residue left after peeling in a small amount of several percent.

It is also demonstrated that the above advantage can be obtained by the employment of the peeling liquid of the present invention. It is also seen that of the various primary amino alcohols, those having a lower molecular weight have a higher penetrability into the resist and as a result permit the completion of peeling operation at a lower temperature in a shorter period of time.

EXAMPLE 5

Peeling liquids were examined for peeling capability according to the same manner as in Example 1 as follows. Specifically, three peeling liquid baths containing the same fresh monoethanolamine were prepared. They were heated to 60° C. Bodies suffered from various conventional etching treatments were immersed successively in the three baths for 2 minutes each, whereby the peeling was conducted for 6 minutes in total. Table 4 shows the results. It is seen that the peeling liquid of the present invention is very effective not only in peeling the resist having a portion of which the quality has been changed by chromium etching but also in peeling the resist having a portion of which the quality has been changed by dry etching treatments with Si, SiN, etc. generally used for manufacturing an electronic device. Moreover, it is also seen that the peeling liquid of the present invention is effective not only in peeling the resist having a portion of which the quality has been changed by etching treatment but also in peeling the resist having a portion of which the quality has been changed by an operation such as ion implantation.

EXAMPLE 6

Peeling liquids were examined for peeling capability according to the same manner as in Example 1 as follows.

Specifically, three peeling liquid baths containing the same fresh peeling liquid heated to a prescribed temperature were prepared. A chromium-etched body was immersed successively in the three baths for 2 minutes each, whereby the peeling was conducted for 6 minutes in total. As the peeling liquids, monoethanolamine, which had been found to have the highest peeling capability in Example 1, was selected.

As a result, it is seen that the peeling liquid of the present invention is markedly effective within a wide temperature range of from room temperature to an elevated temperature higher than 100° C. For preventing the ignition of the peeling liquid and the loss of the peeling liquid due to evaporation, the operating temperature is preferably low. From this point of view, the operating temperature is preferably 90° C. or lower, more preferably 70° C. or lower.

On the other hand, for shortening the period of time for peeling a resist, the operating temperature is preferably high. From this point of view, the operating temperature is preferably 30° C. or higher, more preferably 40° C. or higher.

EXAMPLE 7

Figure 4:
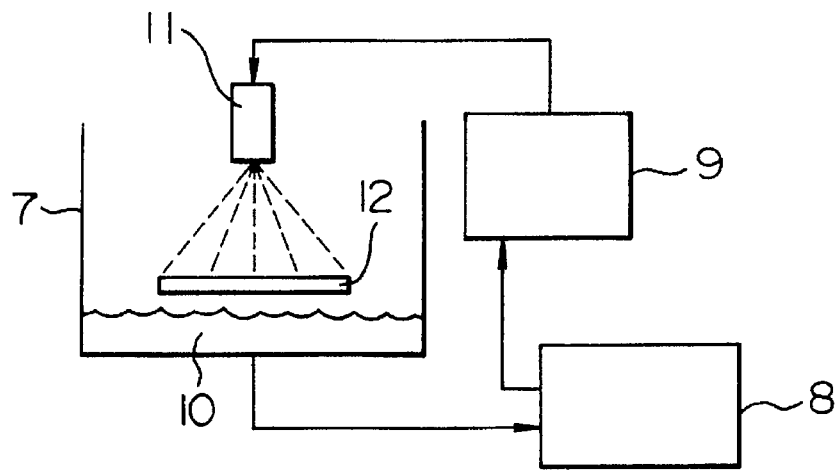
FIG. 4 shows the structure of a spray type peeling apparatus.

For providing a method for more effective utilization of the resist-peeling liquid of the present invention, monoethanolamine was used as the peeling liquid and there was investigated the effect of spray peeling in which the peeling liquid was supplied by the use of a spray type peeling apparatus. It was found that such a method employing the spray peeling was a more effective peeling method, because in this method, a resist was peeled off by simultaneous use of the chemical dissolving power of the peeling liquid and hydrodynamic energy supplied by spraying. FIG. 4 shows a resist-peeling apparatus used. In this apparatus, the peeling liquid 10 was introduced into a spray nozzle 11 from the drain of a spray type peeling bath 7 subjected to temperature adjustment to 60° C. (not shown), through a pump 8 and a filter 9, and sprayed on the resist on a substrate 12.

Figure 5:
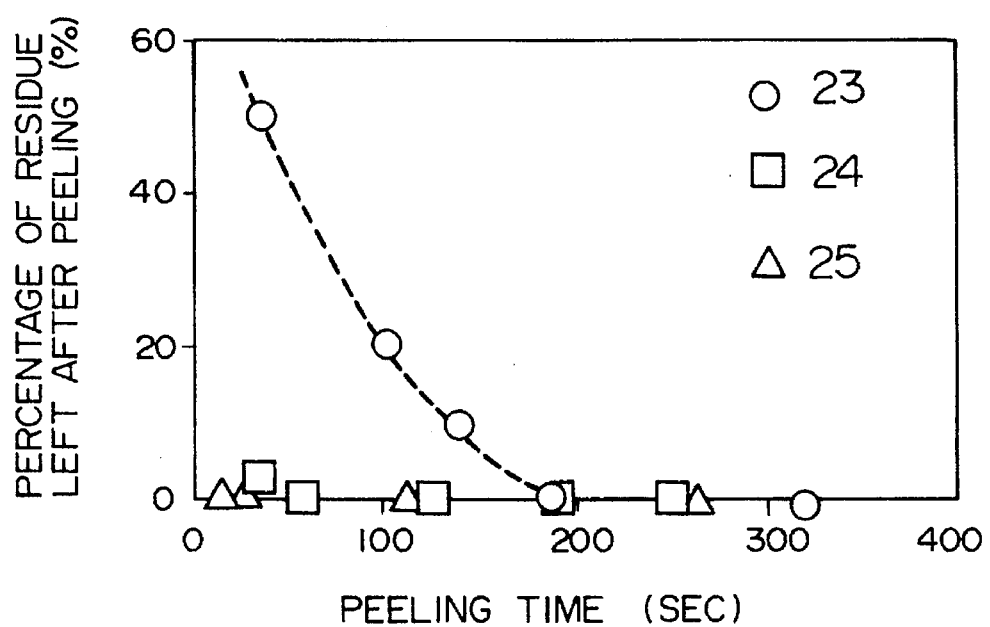
FIG. 5 shows a family of curves of percentage of residue left after peeling vs. peeling time at different peeling methods.

The use of this apparatus with pressurizing the peeling liquid to about 1 kgf/cm$^2$ by a pump shortened the period of time required for complete peeling as compared with the use of immersion peeling. As shown in FIG. 5, the immersion of the body in the peeling liquid at rest took about 3 minutes or more to complete the peeling. In contrast, the use of spray peeling surprisingly reduced the period of time for completing the peeling to about 1 minute.

It should be emphasized that it was the use of the peeling liquid of the present invention having a very high chemical dissolving power that gave the above advantage and the advantage was not obvious at all prior to the present invention. This is because a portion of which the quality has been changed formed on the surface layer of a resist would not be completely removed by the use of a peeling liquid having a low ability to dissolve such a portion and the portion would be left after peeling as a residue, although the spraying treatment accelerates the dissolution of the portion of which the quality has not been changed.

EXAMPLE 8

Figure 6:
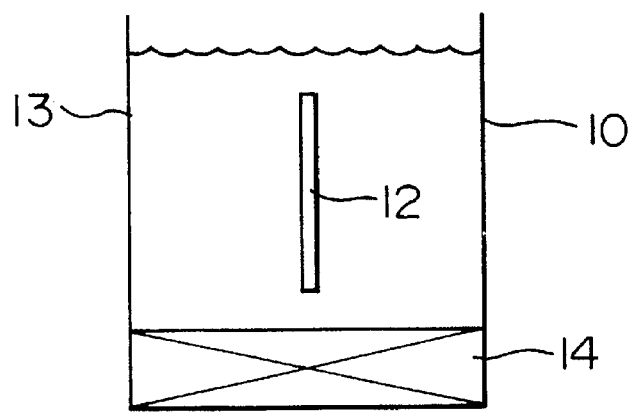
FIG. 6 shows the structure of an ultrasonic peeling apparatus.

For providing a method for more effective utilization of the resist-peeling liquid of the present invention, monoethanolamine was used as the peeling liquid and there was investigated the effect of ultrasonic peeling in which ultrasonic waves were applied to the peeling liquid. There was employed a method in which the ultrasonic peeling bath 13 shown in FIG. 6 was filled with the peeling liquid 10 which had been subjected to temperature adjustment to 60° C. (not shown), the resist on a substrate 12 was peeled off while ultrasonic waves were applied to the peeling liquid from an ultrasonic generator 14 provided in the bottom of the bath.

As shown in FIG. 5, this method was found to be a more effective peeling method, because the chemical dissolving power of the peeling liquid and the effects of the sound brought about by the ultrasonic waves can be cooperatively used at the same time for peeling the resist. Specifically, conducting the peeling by applying ultrasonic waves at 44 KHz and 400 W in an ultrasonic generating bath could shorten the period of time for complete peeling as compared with the immersion peeling or the spray peeling. The immersion peeling took about 3 minutes or more for complete peeling. In contrast, surprisingly, the ultrasonic peeling took only about 30 seconds or less for complete peeling.

It should be emphasized as in Example 7 that it was the use of the peeling liquid of the present invention having a very high chemical dissolving power that gave the above advantage and the advantage was not obvious at all prior to the present invention.

EXAMPLE 9

Figure 7:
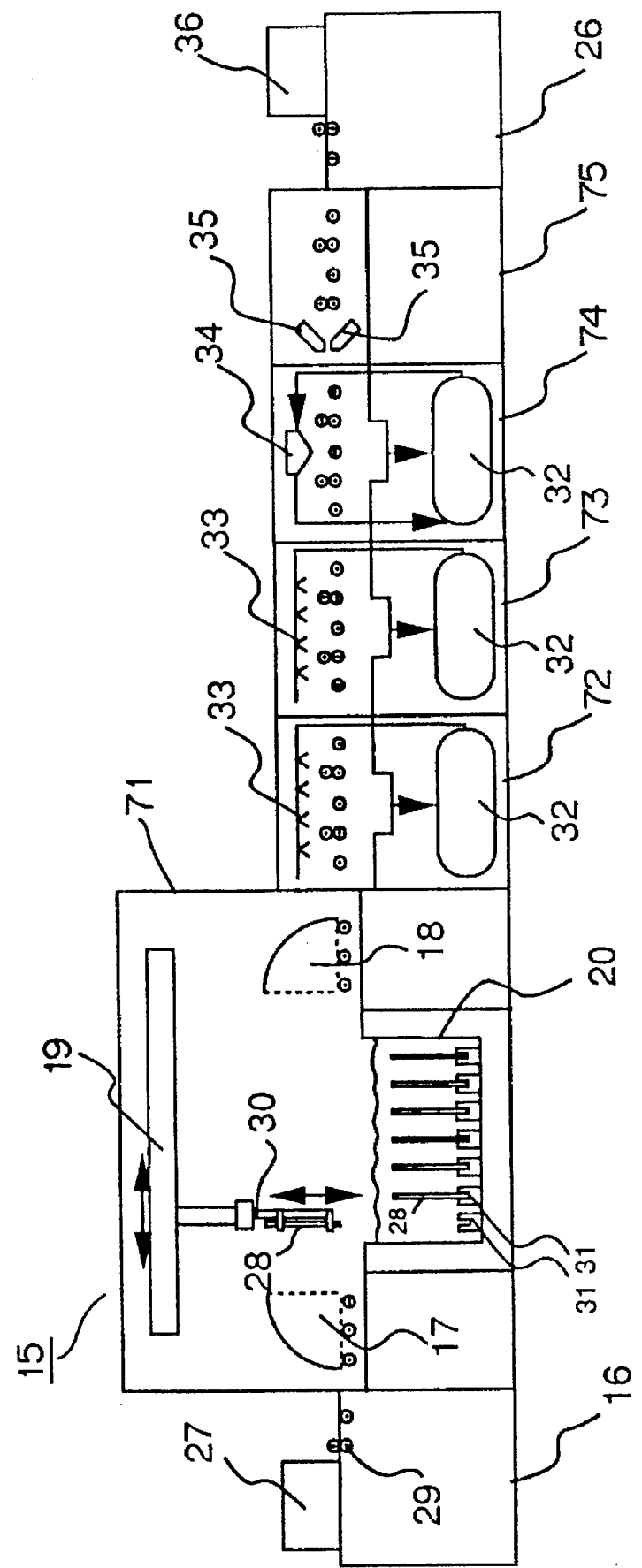
FIG. 7 shows an apparatus for peeling a resist for liquid crystal display.
Figure 8:
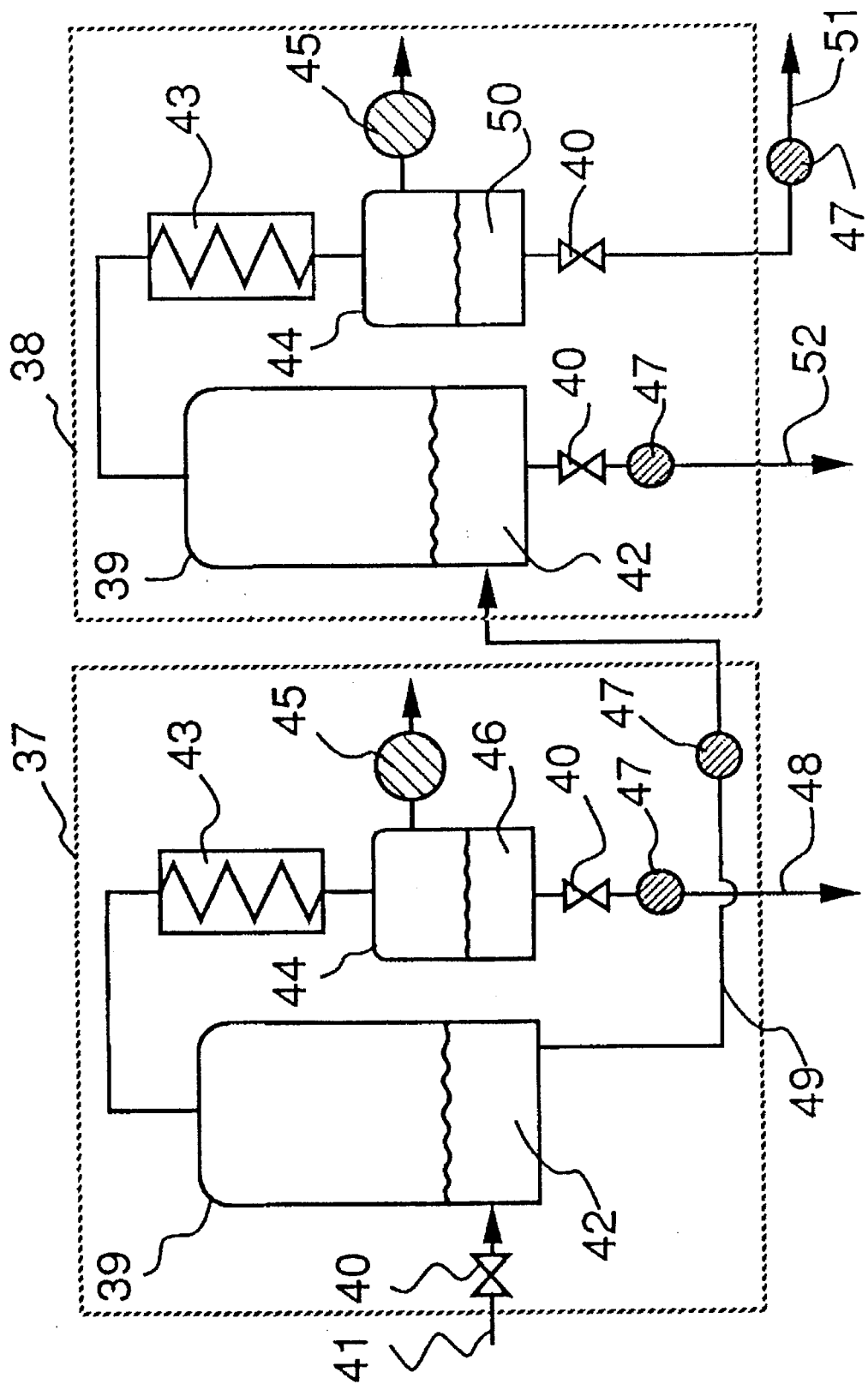
FIG. 8 shows an apparatus for regenerating the used peeling liquid.

An example of the employment of the above-mentioned peeling liquid of the present invention for the production of a liquid crystal display base plate is described below. Resist peeling was tried using the sheet-fed type resist-peeling apparatus 15 shown in FIG. 7 during the formation of a thin film transistor (TFT) device and a wiring on a 200 mm×270 mm glass substrate. The sheet-fed type resist-peeling apparatus 15 of the present invention was composed of a loader unit 16; an immersion-treating unit 71 characterized by being provided with front and back substrate-angularly moving sections 17 and 18, a sheet-fed type transferring system 19 and a sheet-fed type immersion-peeling bath 20; a rinse unit 72; a water-washing unit 73; an ultrasonic water-washing unit 74; a drying unit 75; and an unloader unit 26.

A cassette 27 in which a plurality of substrates were put was set in the loader unit 16. The substrate 28 was withdrawn from the cassette 27 by a loader in the loader unit 16 at a constant time interval (at a tact of 60 sec) and transferred so that the resist-carrying surface of the substrate extends horizontally to the immersion-treating unit 71 through conveyance rollers 29. This operation was repeated. The front substrate-angularly moving section 17 in the immersion-treating unit 71 receives the substrate thus transferred, upon which the substrate was stopped. Subsequently, in the section 17, the substrate was angularly moved so that the resist-carrying surface extends vertically and then rotated by 180° about a vertical axis as stated hereinafter. This position was kept until the substrate was transferred to a conveying robot 30 in the sheet-fed type transferring system 19. Upon completion of the transfer, the operation of receiving another fresh substrate transferred in the same manner as above was repeated at a tact of 60 sec. In the immersion-treating unit 71 characterized by being provided with the sheet-fed type transferring system 19, the conveying robot 30 received the substrate which has been angularly moved so that its resist-carrying surface extends vertically in the front substrate-angularly moving section 17, conveyed the substrate to the predetermined station while keeping the position of the substrate, and placed the substrate in the predetermined one of the substrate-fixing stations 31 in the immersion-peeling bath 20. The above operation was repeated to fill the substrate-fixing stations with the substrates, during which the substrates were immersed. Thereafter, the first immersed substrate was withdrawn and transferred to the back substrate-angularly moving section 18, in which the substrate was angularly moved so that the resist-carrying surface of the substrate extends horizontally and then conveyed while keeping the position to the rinse unit 72.

In the same manner as above, another fresh substrate sent was placed in the vacant station 31 in the sheet-fed type immersion-peeling bath 20, and the secondly immersed substrate was withdrawn from the sheet-fed type immersion-peeling bath 20 and transferred to the back substrate-angularly moving section 18, in which the substrate was angularly moved so that its resist-carrying surface extends horizontally and then conveyed while keeping the position to the rinse unit 72. The conveying robot 30 stood ready for receiving still another fresh substrate.

By repeating the above-mentioned operations at a tact of 60 sec, the front and back sheet-fed type horizontal conveyance treatments and the sheet-fed type immersion treatment were realized in the single unit.

The back substrate-angularly moving section 18 received the substrate of which the resist-carrying surface extends vertically from the conveying robot 30, angularly moving the substrate so that its resist-carrying surface extends horizontally and conveyed the substrate while keeping the position to a next unit. Subsequently, the back substrate-angularly moving section 18 stood ready for receiving another substrate from the conveying robot 30. The above operation was repeated at a tact of 60 sec. In the rinse unit 72, the water-washing unit 73 and the ultrasonic water-washing unit 74, spraying the substrate with a rinse liquid, spraying the substrate with pure water and ultrasonic washing were conducted, respectively, at a tact of 60 sec while the substrate was conveyed horizontally. In each of such units, a treating solution suitable for its purpose was pumped up from the lower tank 32 (not shown) and applied to the substrate by means of a spray nozzle 33 or an ultrasonic washer 34. In the drying unit 75, draining by the air knives 35 and drying were effected while the substrate was horizontally conveyed at a tact of 60 sec. In the unloader unit 26, the substrate sent at a tact of 60 sec was received and put in another cassette 36. The above operation was repeated.

By rotating the substrate of which the resist-carrying surface extends vertically by 180° about a vertical axis in the course of transferring the substrate 28 from the front substrate-angularly moving section 17 to the sheet-fed type immersion-peeling bath 20 and/or from the sheet-fed type immersion-peeling bath 20 to the back substrate-angularly moving section 18, it was possible to allow the resist-carrying surface of the substrate coming out of the back substrate-angularly moving section 18 to face upward.

In the above-mentioned example, the rotation operation was effected in the front substrate-angularly moving section 17; it is, however, emphasized that, in principle, the rotating operation is not restricted to be conducted at the front substrate-angularly moving section 17. It should also be emphasized that it is possible to allow the resist-carrying surface of the substrate to face upward without rotating the substrate.

In the conveying robot, such an action sequence was programmed that the substrates could be withdrawn in the order of placing them in the sheet-fed type immersion-peeling bath 20, namely the first placed substrate could be withdrawn first.

About 50 liters of monoethanolamine was placed in the sheet-fed immersion-peeling bath 20 and a substrate having laminated thereto a resist was immersed therein to peel the resist from the substrate by an immersion method. The peeling time could be set at an integer time the tact by programming the action sequence in the sheet-fed type conveying system 19. It is the great feature of the present peeling method that the immersion time can be varied by varying the number of tacts and the number of immersed substrates, whereby the substrates can be treated at a constant tact.

In the present example, the immersing time was set so that six sheets of substrate could be immersed at a tact of 60 sec, so that the immersing time became 6 minutes and a sufficient process margin could be secured.

Incidentally, the number of the immersion-peeling baths was not limited to a single number and a plurality of immersion-peeling baths could be used. In this case, it was effective to move a plurality of substrates simultaneously.

Bodies to be tested were prepared by chromium etching employed in a process for the production of a TFT base plate, wet etching of an ITO transparent electrode, or dry etching of a-Si or SiN. The resist of the thus prepared bodies was peeled off from the glass substrate with the apparatus. Thereafter, the bodies from which the resist had been peeled off were observed to determine whether a residue was left after peeling on the substrate. As a result, it was confirmed that the resist could be completely peeled off without leaving a residue for all the bodies tested in spite of the difference in etching processes.

The results shows that the resist-peeling liquid of the present invention has a very high performance in practical use and is suitable for production of liquid crystal devices and semiconductor devices.

EXAMPLE 10

The used peeling liquids from the plural immersion-peeling units in which peeling had been carried out by the method of Example 9 were introduced as they were at high temperature into the continuous distillation apparatus to regenerate the used peeling liquids.

The used peeling liquid kept at a high temperature which had been used in the peeling operation at 60° contained about 95% by weight of 2-amino-1-ethanol which was the resist-peeling liquid component and also contained about 3% by weight of water and about 2% by weight of photoresist as impurities.

In the regeneration process of the present invention, a two-stage distillation apparatus composed of the first distillation unit 37 and the second distillation unit 38 was used.

The used peeling liquid 42 which had been used in the peeling operation and was kept at a high temperature was introduced from the continuous feed port 41 provided with a valve 40 into a distillation pot 39 provided in the first distillation unit 37. The vapor generated from the used peeling liquid 42 of high temperature was condensed in a condenser 43 and stored in a recovery tank 44. In such a distillation, it is preferable to operate an exhaust pump 45 which bears on the control of vapor pressure and recovery of the vapor so that the temperature of the used peeling liquid as it was could be utilized as the boiling point. In the recovery tank 44, the water 46 contained as a low-boiling component in the used peeling liquid 42 was accumulated. This water was thrown away from the low-boiling component drain 48 through the valve 40 and the pump 47 at a suitable time interval.

The used peeling liquid 42 from which the water content had been removed in the first distillation unit 37 was sent as it was at a high temperature to the distillation pot 39 provided in the distillation unit 38 via the conveyance line 49 through the pump 47. The vapor generated in the distillation pot 39 did not contain water and consisted only of the peeling liquid components. This vapor was condensed in the condenser 43 and stored in the recovery tank 44. Accordingly, it followed that the regenerated peeling liquid 50 was accumulated in the recovery tank 44. In this case, it is preferable to operate the exhaust pump 45 which bears on the control of vapor pressure and recovery of vapor. The regenerated liquid accumulated in the recovery tank 44 was recovered from the recovery drain 51 continuously or at a suitable time interval through the valve 40 and the pump 47. On the other hand, the high-boiling component containing the photoresist remaining in the distillation pot 39 was thrown away from the high-boiling component drain 52 through the valve 40 and the pump 47 at a suitable time interval.

Though not shown in the figures, a heater was provided in the distillation pot 39 so that fine temperature control could be made.

The used peeling liquid was introduced at a rate of about 100 kg/min into the distillation pot 39 in the first distillation unit, said pot having a height of 800 mm and a diameter of 300 mm until the amount of the liquid in the pot became 20 kg, and the water content was vaporized at a pressure of 10 mm Hg at a temperature of about 60° C. The used peeling liquid 42 from which the water content had been removed was taken out of the first distillation pot 39 and sent to the second distillation pot 39 at a rate of about 1 kg/min via the transporting line 49 using the liquid transporting pump 47, and 2-amino-1-ethanol was vaporized under the same conditions as in the first distillation pot to be recovered.

The peeling liquid regenerated by continuous distillation in the regeneration apparatus of the present invention was subjected to analysis of purity by a gas chromatograph method and the Karl Fischer method to find that it was 2-amino-1-ethanol having a water content of about 0.5% by weight or less and being quite free from the resist. Moreover, it was found that the recovery was about 90%. It was also found that the quality of such regenerated peeling liquid was at least equivalent to the fresh peeling liquid before use in the resist-peeling, and no trouble would be caused by reuse of the same in the production of a commercial product.

EXAMPLE 11

Figure 9A:
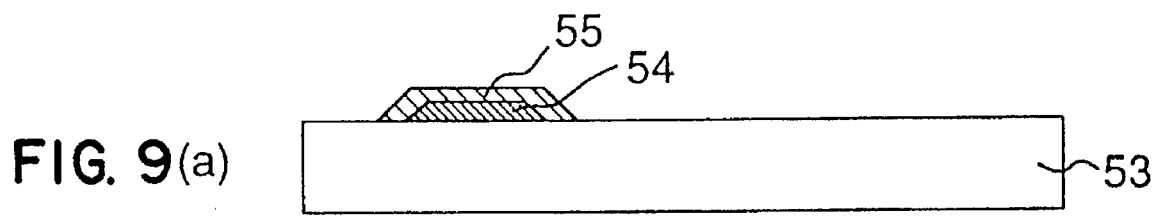
FIG. 9a–e shows a process for producing a TFT substrate.
Figure 9B:
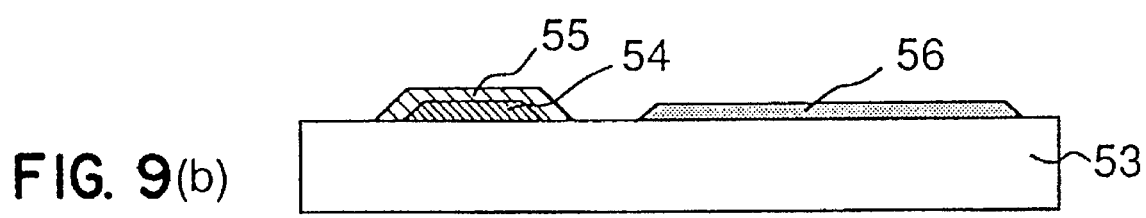
Figure 9C:
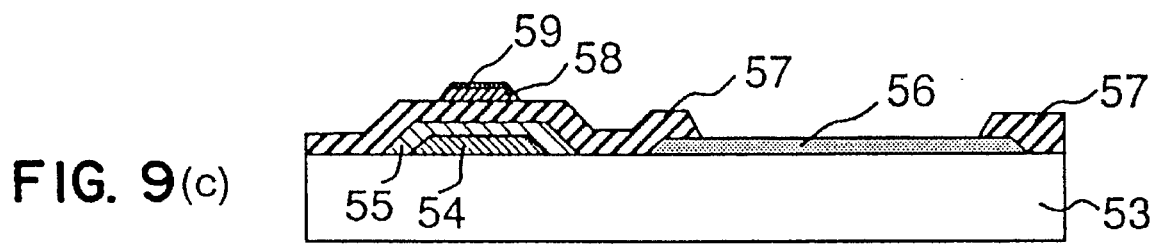
Figure 9D:
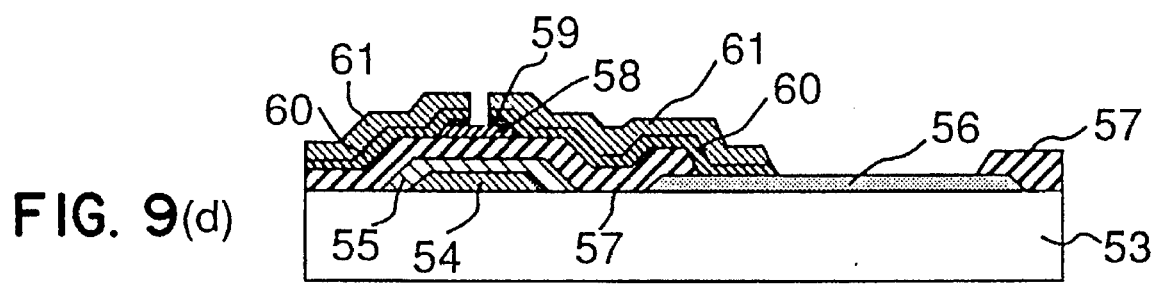
Figure 9E:
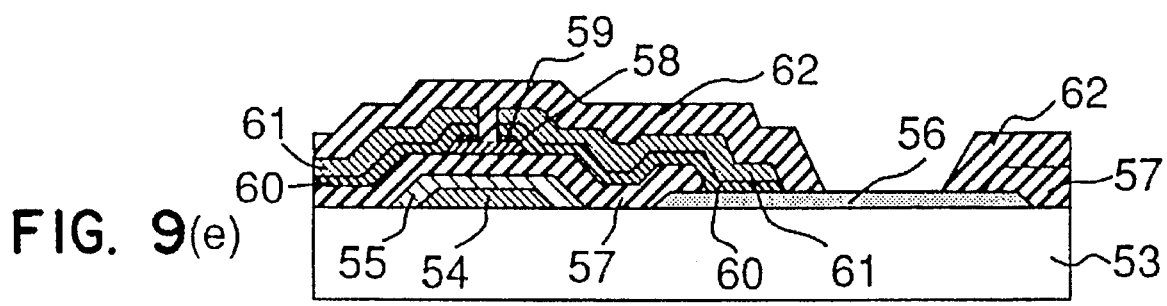

A process for producing a liquid crystal display device using the resist-peeling liquid of the present invention is explained below in accordance with FIG. 9a–c.

A glass substrate 53 having a thickness of 1.1 mm (Corning Inc. 7059 Glass) was washed. Subsequently, a 300-nm aluminum film was deposited thereon by sputtering to form gate electrodes 54. Thereafter, a positive photoresist of 2 µm thick was coated thereon and subjected to exposure and development to form gate wiring patterns. Subsequently, the exposed aluminum film was wet etched with a phosphoric acid etchant. Subsequently, using the same apparatus as in Example 9, the resist was peeled with the peeling liquid of the present invention. Then, an alumina film 55 was formed on the gate electrodes by anodic oxidation to complete the step of forming gate electrodes (FIG. 9 (a)).

140-nm ITO films 56 for forming ITO electrodes were deposited by sputtering on the substrate which had been subjected to the step of forming gate electrodes. Thereafter, a positive photoresist was coated thereon and subjected to exposure and development to form ITO electrode patterns. Subsequently, the exposed ITO film was wet etched with a hydrochloric acid etchant, and then the resist was peeled with the peeling liquid of the present invention using the same apparatus as in Example 9 to complete the step of forming transparent electrodes (FIG. 9 (b)).

Using the CVD method, 300-nm SiN (silicon nitride) film 57, 100-nm a-Si film (i layer) 58 and 30-nm a-Si film (n layer) 59 were successively formed on the substrate which had been subjected to the step of forming transparent electrodes. Subsequently, a positive photoresist was coated thereon and then subjected to exposure and development to form SiN patterns. Thereafter, the exposed SiN film was dry etched with a $SF_6$ gas. Then, the resist was peeled with the peeling liquid of the present invention using the same apparatus as in Example 9. After the peeling, no residue of resist was found at all. Subsequently, in the same manner as in the case of the SiN film 57, the a-Si film 58 and a-Si film 59 were dry etched using a $SF_6$ gas to peel the resist. In this case, no residue of resist was found at all. Thus, the step of forming a gate-insulating film and amorphous silicon islands was completed (FIG. 9 (c)).

A 50-nm chromium film 60 and a 300-nm aluminum film 61 for source and drain electrodes were deposited by sputtering on the substrate which had been subjected to the dry etching of the SiN film 57, a-Si film 58 and a-Si film 59. Thereafter, a positive photoresist was coated thereon and subjected to exposure and development to form a source and drain wiring pattern. Subsequently, the exposed aluminum film was wet etched with a phosphoric acid etchant, after which the exposed chromium film was wet etched with a cerium etchant. Thereafter, the exposed a-Si film (n layer) was dry etched with a $SF_6$ gas. Subsequently, the resist was peeled with the peeling liquid of the present invention using the same apparatus as in Example 9. After the peeling, no residue of resist was found at all. Thus, the step of forming source and drain electrodes was completed (FIG. 9 (d)).

A 300-nm SiN film 62 for passivation was formed by the CVD method on the substrate which had been subjected to the step of forming source and drain electrodes. Subsequently, a positive photoresist was coated thereon and then subjected to exposure and development. Thereafter, the exposed SiN film was dry etched with a $SF_6$ gas and then the resist was peeled with the peeling liquid of the present invention using the same apparatus as in Example 9. After the peeling, no residue of resist was found at all. Thus, the step of forming a passivation film was completed (FIG. 9 (e)).

By the above steps, a TFT substrate was accomplished. In each of the steps, the peeling of the quality-changed resist surface was repeated; nevertheless, in all the peeling operations, no breaking of wire was found at all, and in addition, since no intermediate of resist residue was present between thin film layers, the insulation characteristics between layers was remarkably good. When a TFT-LCD was produced from a combination of the TFT substrate obtained by the above process with a color filter substrate, the yield was markedly high, and hence, it was found that a liquid crystal display device having high performance could be provided at a low cost.

COMPARATIVE EXAMPLE

The resist-peeling liquid of the present invention was compared with other peeling solvents in characteristics by the following two methods. One method is a method of measuring the percentage of residue left after peeling by the same procedure as in Example 1. Another method is a method of measuring a time required for dissolution of a resist of 4 μm in thickness. As described above, the measurement of the percentage of residue left after peeling corresponds to the determination of the peeling capability for a resist having a portion of which the quality has been changed by etching. The measurement of the time required for the dissolution corresponded to the determination of the time required for the peeling. With respect to these items, amino alcohols were compared with polar solvents having a high boiling point (about 150° C. or higher) and a high water-solubility in peeling capability. The temperature at peeling was 60° C. in every case. The percentage of the residue left after peeling was measured after conducting peeling for 6 minutes using each solvent.

Figure 10:
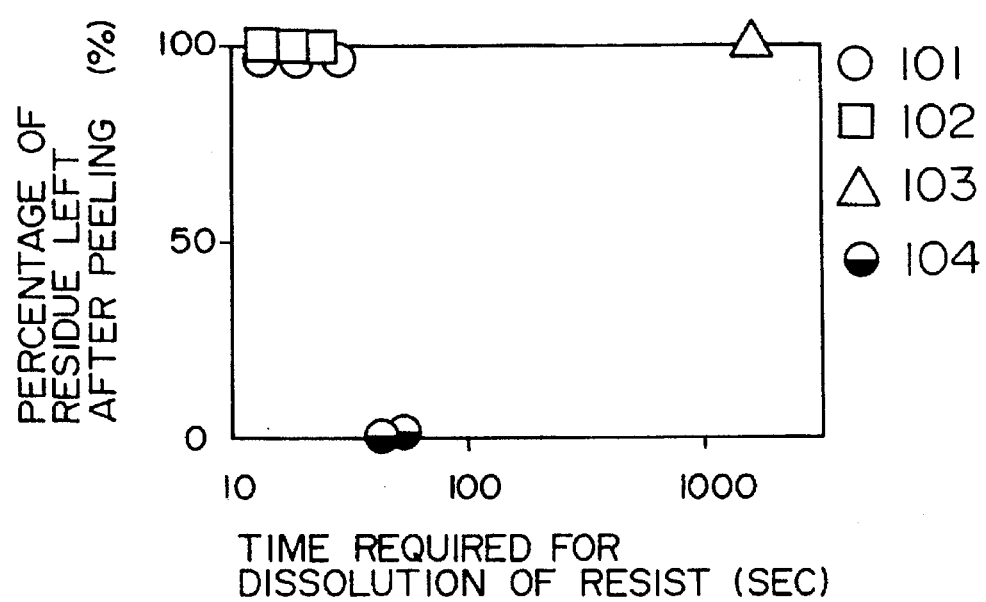
FIG. 10 shows a family of plots of percentage of residue left after peeling vs. time required for dissolution of a resist at different solvents.

FIG. 10 shows the results. For the aprotic solvents (e.g. N-methyl-2-pyrrolidone, dimethyl sulfoxide and propylene carbonate) and the protic polar solvents (e.g. butyl Cellosolve, dipropylene glycol methyl ether and butyl lactate), the time required for dissolution of the resist ranged from 20 to 60 seconds. The time falled within the practically short peeling time. However, when these solvents were applied to the resist having a portion of which the quality had been changed, the percentage of the residue left after peeling was 100% even after a period of 6 minutes. Thus, these solvents were found to be quite unsuitable for peeling the resist having a portion of which the quality had been changed. For chlorine-containing solvents (e.g. o-dichlorobenzene), the time required for dissolution of the resist was so long that such solvents cannot be practically applied. Moreover, the percentage of residue left after peeling was 100% for chlorine-containing solvents.

In contrast, for monoethanolamine, isopropanolamine and the like, which are representative choices from the peeling liquid of the present invention, the time required for the dissolution of the resist of 4 μm in thickness was within the range of 50 to 60 seconds. The time falls within the practically short peeling time. Moreover, these amines left little or no residue after peeling. Furthermore, these amines show very high peeling capability for the resist having a portion of which the quality has been changed.

As described above, according to the present invention, there are provided a resist-peeling liquid of extremely high performance which can completely peel not only a resist not having a portion of which the quality has been changed but also a resist having a portion of which the quality has been changed by any of various etching processes and does not leave a residue to a subsequent step, and a process for peeling a resist by the use of said resist-peeling liquid. Therefore, it has become possible to produce a liquid crystal display device or a semiconductor device in a very high yield, and it has become possible to provide a highly reliable electronic device at a much lower cost, as compared with the conventional methods. Furthermore, the resist-peeling liquid of the present invention can be recovered and regenerated very economically and hence is advantageous also in that the influence of incineration and disposal of the liquid on the environment can be greatly reduced.

Such technical, economical and environmental advantages attained by the present invention are immeasurable.

TABLE 1

Kind of Amino Alcohol and Percentage of Residue Left After Peeling

| Peeling liquid | Concentration (wt %) | Resist (A) | Resist (B) |
| --- | --- | --- | --- |
| Monoethanolamine (primary) | >95 | 0% | 0% |
| Diethanolamine (secondary) | >95 | 0% | 7% |
| Triethanolamine (tertiary) | >95 | 0% | 100% |

Resist (A): an untreated resist
Resist (B): a chromium-etched resist

TABLE 2

Influence of Dilution with Solvent

| Mono-ethanol-amine | Diluent solvent | | | | | |
| --- | --- | --- | --- | --- | --- | --- |
| | N-methyl-pyrrolidone | | Butyl Cellosolve | | Butyl lactate | |
| concentration (wt %) | Resist (A) | Resist (B) | Resist (A) | Resist (B) | Resist (A) | Resist (B) |
| 40 | 0% | 100% | 0% | 100% | 0% | 100% |
| 60 | 0% | 5% | 0% | 10% | 0% | 6% |
| 80 | 0% | 0% | 0% | 0% | 0% | 0% |
| >95 | 0% | 0% | 0% | 0% | 0% | 0% |

Resist (A): an untreated resist
Resist (B): a chromium-etched resist

TABLE 3

Relationship between the Kind of Amino Alcohol and Residue

| Peeling liquid | Concentration (wt %) | Resist (A) | Resist (B) |
| --- | --- | --- | --- |
| 2-Amino-1-ethanol | >95 | 0% | 0% |
| 1-Amino-2-propanol | >95 | 0% | 4% |
| 2-Amino-1-propanol | >95 | 0% | 3% |
| 1-Amino-2-butanol | >95 | 0% | 5% |
| 2-Amino-1-butanol | >95 | 0% | 5% |
| 5-Amino-1-pentanol | >95 | 0% | 8% |
| 6-Amino-1-hexanol | >95 | 0% | 7% |
| 3-Amino-1,2-propanediol | >95 | 0% | 5% |

Resist (A): an untreated resist
Resist (B): a chromium-etched resist

TABLE 4

Relationship between Substance to be Peeled and Peeling Effect

| Etching condition | Residue left after peeling |
| --- | --- |
| Chromium etching | 0% |
| $O_2$ usher | 0% |
| Si etching + $O_2$ usher | 0% |
| SiN etching + $O_2$ usher | 0% |

What is claimed is:

1. A process for producing a liquid crystal display device which comprises the steps of:

(A) forming gate electrodes on a substrate, (B) forming transparent electrodes on the substrate obtained in step (A), (C) forming a gate-insulating film and amorphous silicon islands on the substrate obtained in step (B), (D) forming source and drain electrodes on the substrate obtained in step (C), and (E) forming a passivation film on the substrate obtained in step (D), characterized in that the resist-peeling in at least one of steps (A) to (E) is effected by a method comprising the steps of:

(a) changing the quality of a novolak positive resist layer on a substrate by an oxidative wet etching solution of metallic chromium, dry etching of silicon or aluminum, dry etching using oxygen plasma or ion implantation, (b) contacting the changed resist of step (a) with a liquid comprising 80% by weight or more of 2-amino-1-ethanol, and (c) removing the liquid containing the thus peeled resist from the surface of the etched resist.

2. The process of claim 1, wherein step (b) includes the steps of:

(i) transferring the substrate obtained by step (a) having a surface carrying the changed resist so that the changed resist-carrying surface extends horizontally, (ii) angularly moving the substrate transferred from step (i) so that the changed resist-carrying surface extends vertically, (iii) immersing the substrate angularly moved in step (ii) in a liquid comprising 80% by weight or more of 2-amino-1-ethanol while keeping its position, (iv) withdrawing the substrate immersed in the liquid in step (iii) from the liquid while keeping its position, and (v) angularly moving the substrate withdrawn from the liquid in step (iv) so that the changed resist-carrying surface extends horizontally.

3. The process of claim 2, wherein at least one of steps (i) to (v) includes the step of carrying out an operation to allow the changed resist-carrying surface of the substrate coming out of step (v) to face upward.

4. The process of claim 2, wherein step (iii) includes the step of carrying out immersion-treatment of at least two sheets of substrate in parallel using a bath provided with at least two stations for fixing the substrate and filled with a liquid comprising 80% by weight or more of 2-amino-1-ethanol.

5. The process of claim 2, wherein step (iii) includes the step of letting a conveying robot repeat at a constant time interval an operation comprising:

(1) receiving the substrate coming out of step (ii), (2) placing the substrate at a station in a bath provided with at least two stations for fixing the substrate and filled with a liquid comprising 80% by weight or more of 2-amino-1-ethanol, (3) withdrawing a substrate which has been fixed at another station of the bath, and (4) transferring the withdrawn substrate to step (iv).

6. The process of claim 5, wherein the action sequence of the conveying robot is programmed so that the substrates are withdrawn in the order of fixing them at the station in the bath.

7. The process of claim 1, wherein the step (c) includes the steps of:

(i) rinsing the substrate obtained in step (b), (ii) subjecting the substrate rinsed in step (i) to at least one washing treatment selected from the group consisting of spray-washing and ultrasonic washing, and (iii) drying the substrate washed in step (ii).

8. A process for producing a liquid crystal display device which comprises the steps of:

(A) forming gate electrodes on a substrate, (B) forming transparent electrodes on the substrate obtained in step (A), (C) forming a gate-insulating film and amorphous silicon islands on the substrate obtained in step (B), (D) forming source and drain electrodes on the substrate obtained in step (C), and (E) forming a passivation film on the substrate obtained in step (D), characterized in that the resist-peeling in at least one of steps (A) to (E) is effected by a method comprising the steps of:

(a) changing the quality of a novolak positive resist layer on a substrate by an oxidative wet etching solution of metallic chromium, dry etching of silicon or aluminum, dry etching using oxygen plasma or ion implantation, (b) contacting the changed resist of step (a) with a liquid comprising 80% by weight or more of 2-amino-1-ethanol, (c) removing the liquid containing the thus peeled resist from the surface of the etched resist, and (d) regenerating a liquid containing 80% by weight or more of 2-amino-1-ethanol by distillation from the liquid used in step (c) and reusing the regenerated liquid in step (b).

9. The process of claim 8, wherein step (d) includes the steps of:

(i) removing low-boiling components from the liquid used in step (c) by distillation, and (ii) removing high-boiling components from the liquid used in step (c) by distillation.

10. The process of claim 9, wherein said low-boiling components comprise water.

11. The process of claim 9, wherein said high-boiling components comprise the peeled resist.

12. The process of claim 8, wherein the liquid used in step (b) and the liquid regenerated in step (d) contain 95% by weight or more of 1-amino-2-ethanol.

* * * * *